US008670957B2

(12) United States Patent
Dayde et al.

(10) Patent No.: US 8,670,957 B2
(45) Date of Patent: Mar. 11, 2014

(54) AUTOMATIC POSITIONING OF SECONDARY OBJECTS

(75) Inventors: Guillaume Romain Dayde, Grasse (FR); James René Michel Dugalais, Valbonne (FR); Christophe René Francis Delfino, Cagnes sur Mer (FR)

(73) Assignee: Dassault Systemes, Villacoublay (FR)

( * ) Notice: Subject to any disclaimer, the term of this patent is extended or adjusted under 35 U.S.C. 154(b) by 278 days.

(21) Appl. No.: 13/155,942

(22) Filed: Jun. 8, 2011

(65) Prior Publication Data

US 2012/0316840 A1    Dec. 13, 2012

(51) Int. Cl.
*G06F 17/50* (2006.01)
*G06F 3/048* (2013.01)
*G06G 5/00* (2006.01)

(52) U.S. Cl.
USPC ............... 703/1; 715/772; 345/676; 345/662; 345/651

(58) Field of Classification Search
USPC ............... 703/1; 715/772; 345/676, 662, 651
See application file for complete search history.

(56) References Cited

U.S. PATENT DOCUMENTS

| 5,548,707 | A  | 8/1996 | LoNegro et al. |
| 6,232,985 | B1 | 5/2001 | Chase et al. |
| 6,346,943 | B1 | 2/2002 | Thoemmes et al. |
| 6,911,981 | B2 | 6/2005 | Thoemmes et al. |

OTHER PUBLICATIONS

User's Guide, "3D Functional Tolerancing & Annotation", Version 5, Release 16, 2005.*
SolidWorks, "Wolid Works Help-Alligning Dimensions and Notes", 2010.*
SolidWorks, "Wolid Works Help-Align Toolbar", 2010.*
AutoCAD, NPL, "AutoCAD 2010 user Documentation", 2009.*
"Drawing Snap Lines," *Synthesis Engineering Services Inc.*, 2 pgs., Dec. 1999.
Steffen, D. and Graham, G., "Inside Pro/Engineer Wildfire," *OnWord Press, 4th Edition*, Thomson Delmar Learning, 16 pages—including Ch. 12 p. 307 (2004).

* cited by examiner

*Primary Examiner* — Omar Fernandez Rivas
*Assistant Examiner* — Angel Calle
(74) *Attorney, Agent, or Firm* — Hamilton, Brook, Smith & Reynolds, P.C.

(57) ABSTRACT

A computer-aided design station for use in computer-aided design of a modeled object includes a display device configured to display the modeled object and at least one secondary object in a viewing area, an interface device configured to receive user inputs relating to the modeled object and the viewing area, and a processor operably coupled to the display device and the interface device. The processor is configured to cause the display device to display an alignment tool in the viewing area in response to user input and cause the display device to display at least one attach point of the secondary object in response to user input. The processor is also configured to detect when the alignment tool is moved to a position within a first preselected distance from the secondary object and automatically align the secondary object with respect to the alignment tool.

25 Claims, 12 Drawing Sheets

AUTOMATIC POSITIONING OF SECONDARY OBJECTS

BACKGROUND OF THE INVENTION

The embodiments described herein relate generally to Computer-aided design (CAD) and, more particularly, to automatically aligning one or more secondary objects using an alignment tool.

Computer-aided design software allows a user to construct and manipulate complex three-dimensional (3D) models. A number of different modeling techniques can be used to create a 3D model. These techniques include, for example, solid modeling, wire-frame modeling, and surface modeling. Some known solid modeling techniques provide for topological 3D models, where the 3D model is a collection of interconnected topological entities such as vertices, edges, and faces. Moreover, some known topological entities have corresponding supporting geometrical entities such as points, trimmed curves, and trimmed surfaces. Trimmed surfaces correspond to the topological faces bounded by the edges. Some known wire-frame modeling techniques, on the other hand, can be used to represent a model as a collection of simple 3D lines, whereas surface modeling can be used to represent a model as a collection of exterior surfaces. CAD systems may combine these and other modeling techniques, such as parametric modeling techniques. Parametric modeling techniques can be used to define various parameters for different features and components of a model, and to define relationships between those features and components based on relationships between the various parameters.

A design engineer is one typical user of at least some known 3D CAD systems. A design engineer designs physical and aesthetic aspects of 3D models, and is skilled in 3D modeling techniques. The design engineer creates parts and may assemble the parts into a subassembly. A subassembly may also consist of other subassemblies. An assembly is designed using parts and subassemblies.

At least some known CAD systems may also support two-dimensional (2D) objects, which are 2D representations of 3D objects. Two-dimensional and three-dimensional objects are useful during different stages of a design process. Three-dimensional representations of a model are commonly used to visualize a model in a physical context because the designer can manipulate the model in 3D space and can visualize the model from any conceivable viewpoint. Two-dimensional representations of a model are commonly used to prepare and formally document the design of a model. A 2D representation of the 3D model is referred to as a 2D drawing, or simply, a drawing. A 2D drawing contains one or more drawing views where each view illustrates the model in a specific orientation (e.g., top, front, or left view), or illustrates a detail or section view of the model. In general, the 2D drawing is used to communicate the design to a manufacturing engineer so that the physical object corresponding to the 2D drawing, and therefore, also corresponding to the 3D model, can be built.

Formally documenting a design includes annotating a CAD model using a set of geometric dimensioning formulations thereby enabling a design engineer to communicate the configuration of a part, a subassembly, or an assembly to a manufacturing engineer. The International Standards Organization (ISO) and the American Society of Mechanical Engineers (ASME), among others, establish design and manufacturing standards, which are uniform practices for stating and interpreting dimensioning data. However, annotating a 3D model or a 2D drawing that represents a 3D model in a manner that is clear, concise, and compliant to ASME, ISO, or other dimensioning and tolerancing standards can be an arduous task. Such annotating of 2D drawings may be one of the most tedious and time consuming CAD requirements, which becomes more complicated the more complex the CAD design.

Using at least some known CAD systems, a design engineer may create dimension annotations using a freeform technique. For example, the design engineer can place dimension annotations anywhere within the drawing by moving (e.g., dragging) the dimension indicia (e.g., dimension annotation text or leader line) using a cursor-controlled I/O device, such as a mouse. However, the design engineer should comply with a defined standard. The defined standard governs the offset distances of the dimension lines, on which side of an edge the dimension annotation should be placed, and the angle of a leader (if applicable). Typically in a 2D drawing that complies to a predefined standard, when a dimension is being added to a model, there are predetermined limited logical locations the dimension indicia can be placed. Moreover, design engineers need to select a location where leader lines and text do not overlap. Although sometimes leader lines do need to overlap for lack of space, the text should never overlap. Furthermore, the design engineer often has to manually lineup dimension indicia of one dimension annotation with dimension indicia of other dimension annotations to create a legible and aesthetically pleasing drawing. As more dimensions are added, the area available to place subsequent dimension annotations is reduced, especially since the dimensions already placed are fixed until the design engineer manually changes them.

Similarly, design engineers may need to include secondary images for use in better exhibiting properties of the design. For example, a design engineer may include one or more 2D drawings that illustrate different viewing angles of a 3D model. The design engineer needs to select a location where the 2D drawings and the 3D model do not overlap to avoid obscuring properties and/or features of the 3D model. Furthermore, the design engineer often has to manually lineup the 2D drawings to create a legible and aesthetically pleasing presentation. As more 2D drawings, annotations, and the like are added, the area available to place subsequent drawings and/or annotations is reduced.

Accordingly, a need exists for a design engineer to apply secondary objects, such as 2D drawings, annotations, and the like within a presentation of a 3D model without requiring the time-consuming manual entry and organization methods described above.

BRIEF DESCRIPTION OF THE INVENTION

In one aspect, a computer-aided design station is provided for use in computer-aided design of a modeled object includes a display device configured to display the modeled object and at least one secondary object in a viewing area, an interface device configured to receive user inputs relating to the modeled object and the viewing area, and a processor operably coupled to the display device and the interface device. In response to respective user inputs, the processor is configured to cause the display device to display an alignment tool in the viewing and to cause the display device to display at least one attach point of the secondary object. The processor is also configured to detect when the alignment tool is moved to a position within a first preselected distance from the secondary object and automatically align the secondary object with respect to the alignment tool.

In another aspect, one or more computer-readable storage media include computer-executable components are provided for use in computer-aided design of a modeled object. The components include a display component that when executed by at least one processor causes the processor to present the modeled object and a plurality of secondary objects in a viewing area of a display device, and an interface component that when executed by the processor causes the processor to receive user inputs. The components also include an alignment component that when executed by the processor causes the processor to present an alignment tool in the viewing area and present at least one attach point of at least a portion of the secondary objects in response to user inputs. The alignment component also causes the processor to detect when the alignment tool is moved to a position within a first preselected distance from the secondary objects and to automatically align the secondary objects with respect to the alignment tool.

In another aspect, a computer-implemented method includes displaying a modeled object and a plurality of secondary objects in a viewing area of a display device, receiving user inputs relating to at least one of the modeled object, the secondary objects, and the viewing area, and displaying an alignment tool and at least one attach point of one or more of the secondary objects in the viewing area in response to respective user inputs. The method also includes detecting when the alignment tool is moved to a position within a first preselected distance from one or more of the secondary objects and automatically aligning one or more of the secondary objects with respect to the alignment tool.

In yet another aspect, a system is provided for use in computer-aided design of a modeled object. The system includes a memory area configured to store at least one attach point related to each of a plurality of secondary objects. The system also includes a computer system coupled to the memory area and configured to present the modeled object and one or more of the secondary objects in a viewing area of a display device and receive user inputs relating to the modeled object and the viewing area. In response to respective user inputs, the computer system is configured to present an alignment tool in the viewing area and present the at least one attach point associated with one or more of the secondary objects. The computer system is also configured to detect when the alignment tool is moved to a position within a first preselected distance from one or more of the secondary objects, and automatically align one or more of the secondary objects with respect to the alignment tool.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

Exemplary embodiments of systems, methods, apparatus, and computer-readable storage media for use in computer-aided design of a modeled object are described herein. The embodiments described herein facilitate automatically positioning and/or organizing secondary objects within a viewing area, with respect to a modeled object. Automatic positioning enables a design engineer or other suitable user to more rapidly create a complete design of an object.

Figure 1:
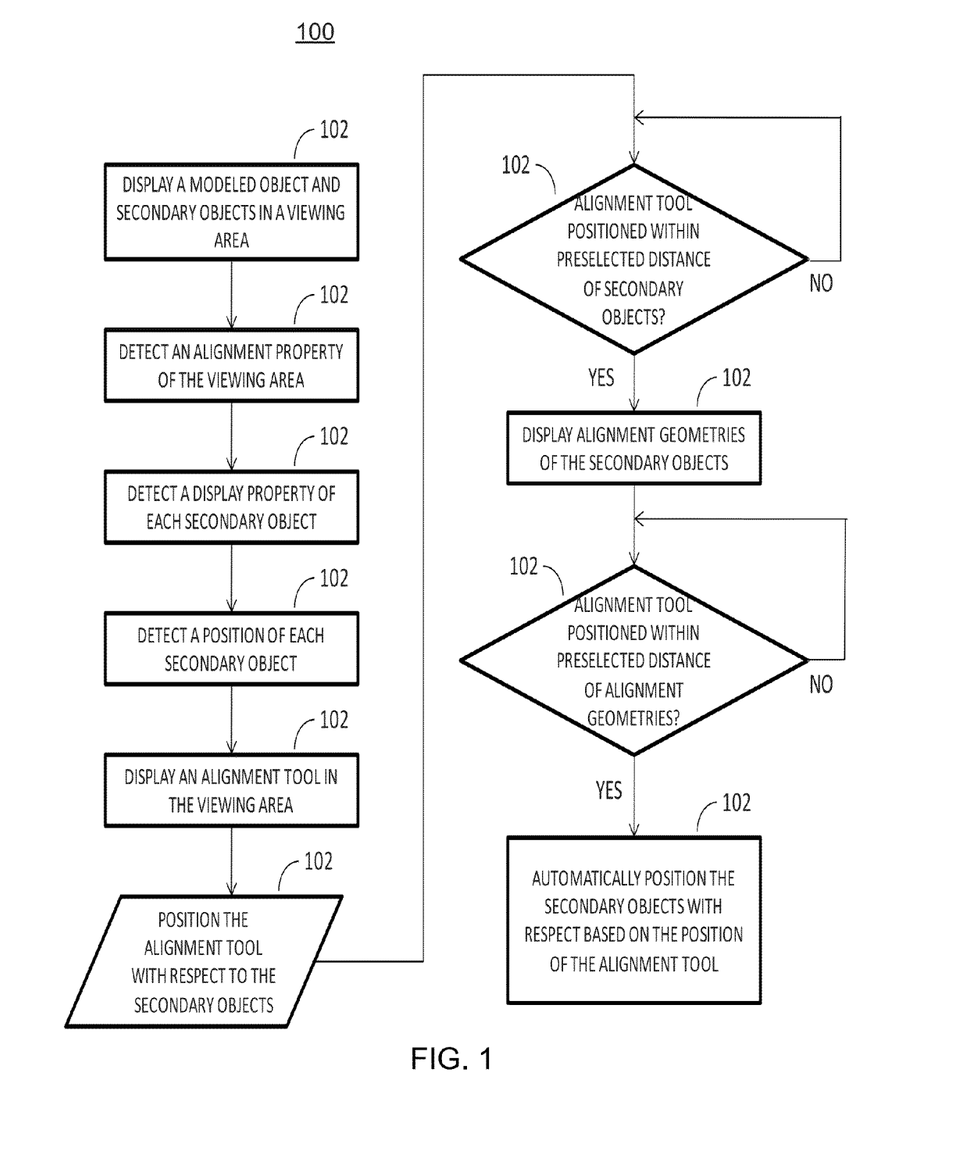
FIG. 1 is a flowchart illustrating an exemplary computer-implemented method for use in automatically aligning one or more secondary objects using an alignment tool.
Figure 2:
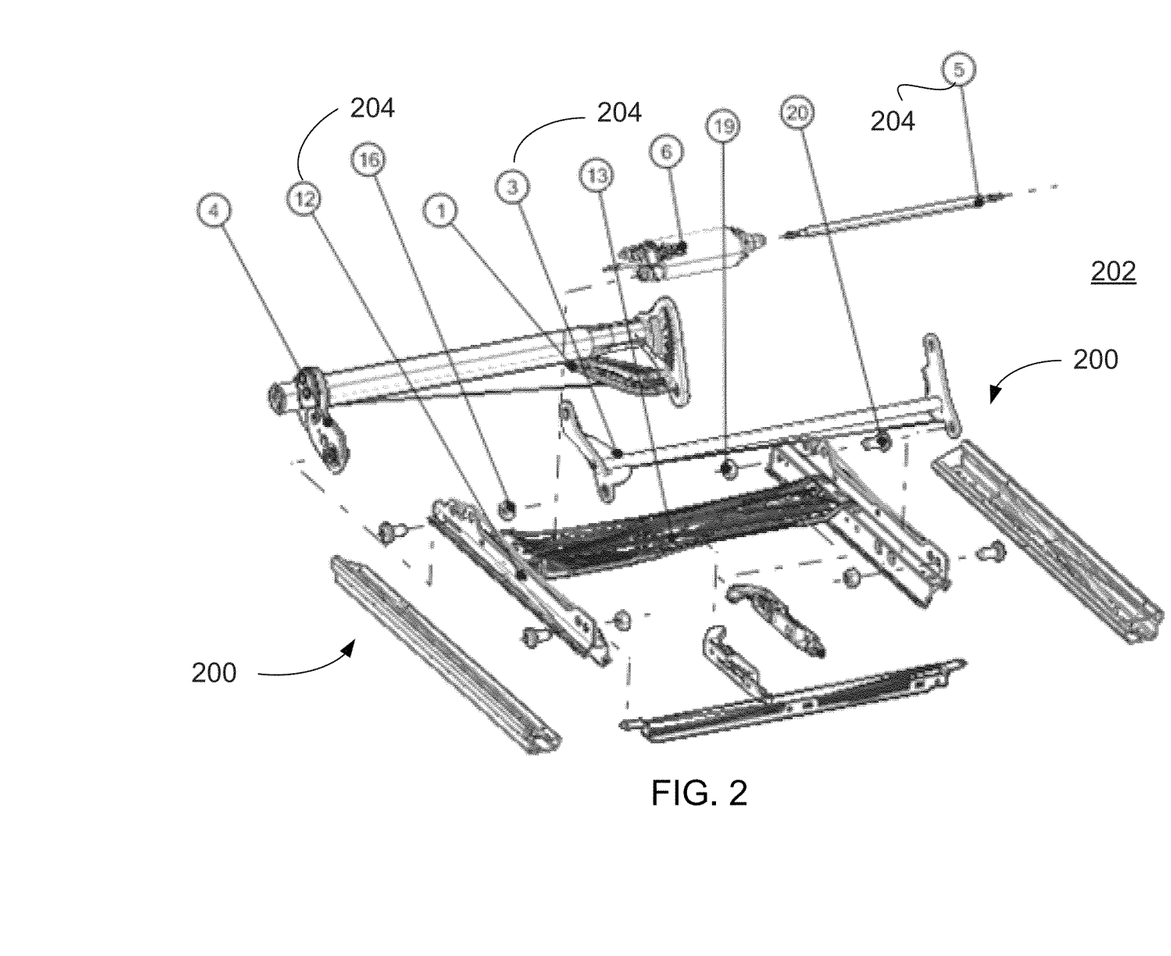
FIGS. 2-8 are renderings of a modeled object with secondary objects applied thereto according to embodiments of the present advancements.

Referring now to the drawings, wherein like reference numerals designate identical or corresponding parts throughout the several views, embodiments described herein relate to systems, methods, apparatus, and computer-readable storage media for use in computer-aided design of a modeled object. FIG. 1 is a flowchart 100 illustrating an exemplary computer-implemented method for use in automatically aligning one or more secondary objects using an alignment tool. In an exemplary embodiment, a user initiates a computer-aided design (CAD) application using a computer-aided design station, a computer system coupled to a memory area, or any other suitable computer device. During use of the CAD application, and as shown in FIG. 2, the user creates and/or modifies a modeled object 200, such as a solid-surface model of a real-world object that is presented in a viewing area 202 of a display device. The modeled object 200 may be presented in a two-dimensional (2D) form or in a three-dimensional (3D) form. Notably, the embodiments described herein are not limited to use in only 2D CAD applications or 3D CAD applications but, rather, may be applied to both types of applications. During the creation and/or modification of the modeled object 200, the user may also create and/or modify one or more secondary objects 204 within the viewing area 202. Accordingly, in an exemplary embodiment, the computer-aided design station or computer system displays 102 the modeled object 200 and the secondary objects 204 in the viewing area 202. Although FIG. 2 shows the modeled object 200 as a 3D object and the secondary objects 204 as 2D objects, it should be understood that embodiments of the invention are not so limited.

Moreover, the computer detects 104 an alignment property of the viewing area 202. For example, the alignment property may determine whether 2D secondary objects can be positioned with the alignment tool described herein, whether 3D secondary objects can be positioned with the alignment tool, or whether both 2D and 3D secondary objects can be positioned with the alignment tool. Additionally, the alignment property can indicate that neither 2D secondary objects nor 3D secondary objects can be positioned with the alignment tool. The alignment property may be set by a user within the CAD application. Alternatively, the alignment property may be automatically set by the computer based on, for example and without limitation, one or more other properties of the viewing area 202 and/or one or more properties of the modeled object 200.

In an exemplary embodiment, the computer also detects 106 a display property of each of the secondary objects 204. For example, each secondary object 204 may be presented in the viewing area 202 as a 2D object or a 3D object. The display property for the secondary objects 204 may be individually set or may be set for groups of more than one secondary object 204. Moreover, the display property may be automatically set based on the viewing area 202 and/or the presentation of the modeled object 200. Similarly, the computer also detects 108 a position of each secondary object 204 within the viewing area 202. For example, the computer may detect or determine the position of one or more specified points along an edge or border of each secondary object 204. Alternatively, or in addition, the computer may detect or determine the position of a center point or a specified point within the perimeter of each secondary object 204. As described in greater detail below, these points, whether along the border or within the border of a secondary object 204, are used to position the secondary object 204 using an alignment tool. Moreover, these points are referred to herein as attach points.

Figure 3:
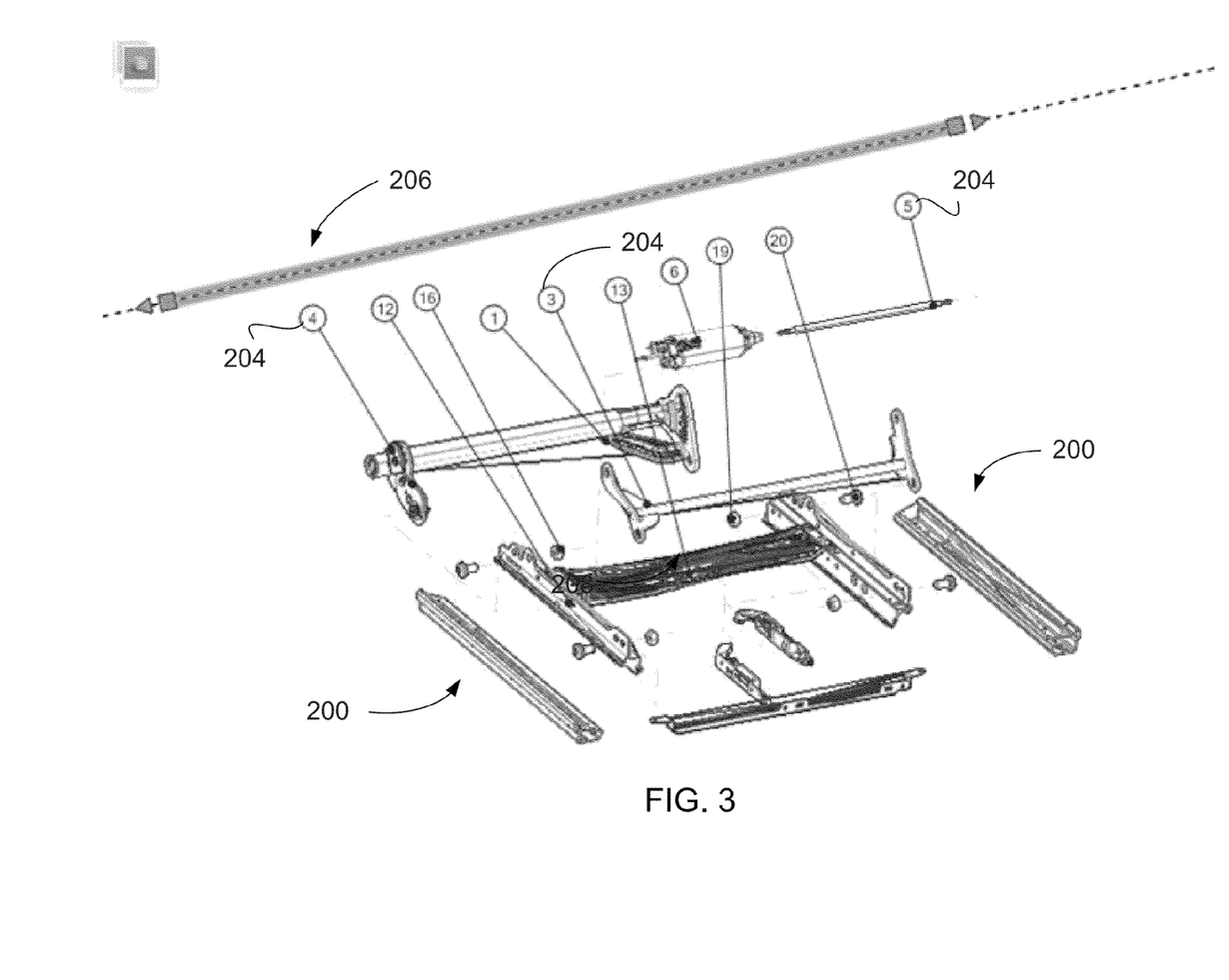

In response to user input, and as shown in FIG. 3, the computer displays 110 an alignment tool 206 in the viewing area 202. In one embodiment, the alignment tool 206 is a line or bar. The length of the line may be user-defined. Moreover, the length of the line may be adjustable according to user input. In such an embodiment, the user defines the alignment tool 206 by, for example, indicating a position in the viewing area 202 of a first point and then by indicating a position in the viewing area 202 of a second point. The computer creates an instance of the alignment tool 206 between the first and second points. In an alternative embodiment, the alignment tool 206 may be a circle or any other suitable shape that facilitates positioning secondary objects 204 within the viewing area 202. In such an alternative embodiment, the user defines the alignment tool 206 by, for example, indicating a first point of the alignment tool 206, such as a center point, and then indicating a second point of the alignment tool 206, such as a point that defines the outer perimeter of the alignment tool. The computer creates an instance of the alignment tool 206 such that the perimeter is defined by a distance between the first and second points.

Figure 4:
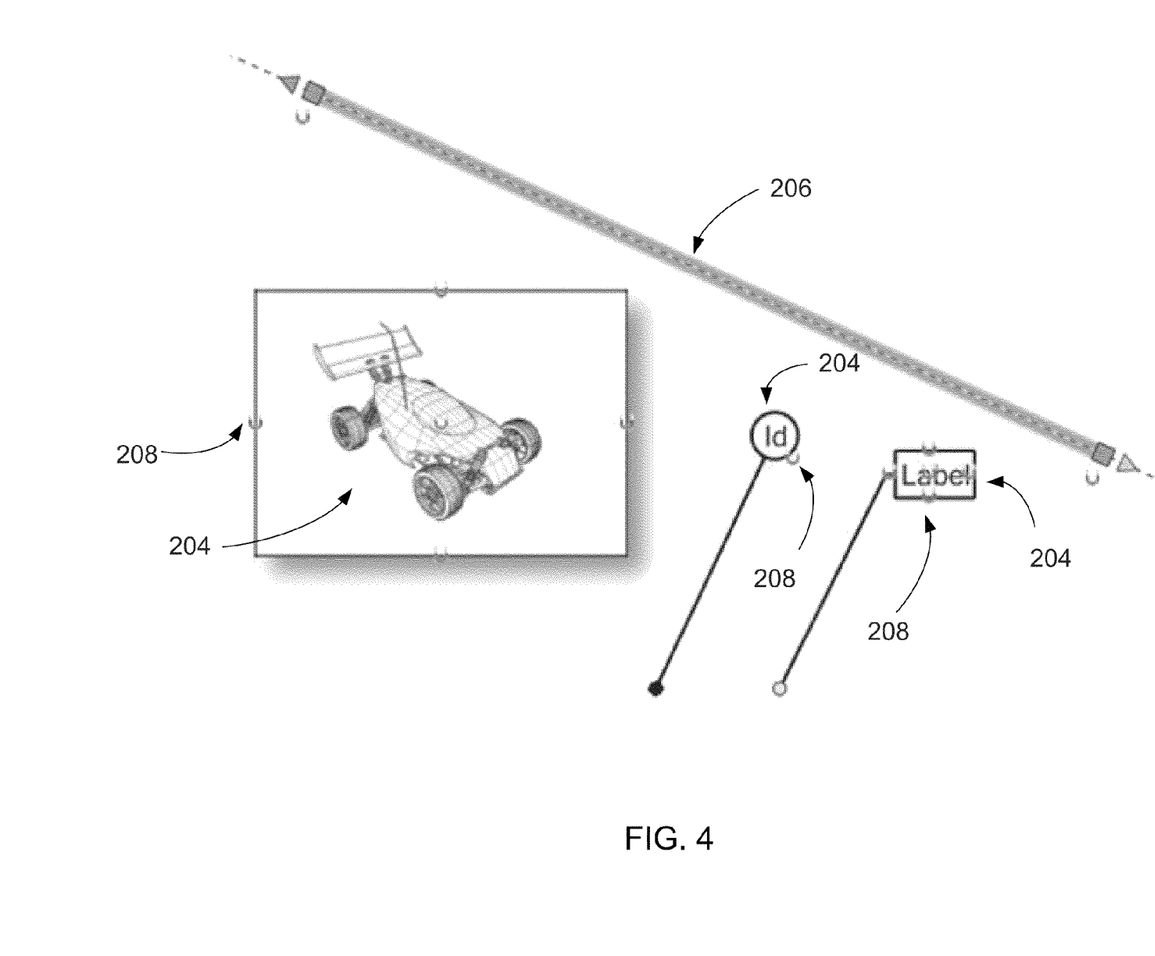

In an exemplary embodiment, the user causes the computer to position 112 the alignment tool 206 within the viewing area 202 with respect to one or more of the secondary objects 204. For example, the user may "drag" the alignment tool 206 using a mouse or any other suitable cursor positioning system, such as using a display device having touchscreen capabilities. Alternatively, the user may designate via pixel values, for example, the position at which the alignment tool 206 is to be displayed. As the alignment tool 206 is positioned 112 within the viewing area 202, the computer detects 114 whether the alignment tool 206 is located within a preselected distance of one or more of the secondary objects 204. The distance may be measured in pixels, for example. If the alignment tool 206 is not located within a preselected distance from a secondary object 204, the computer continues to measure and detect 114 whether the alignment tool 206 is located within a preselected distance from the secondary object 204. However, as shown in FIG. 4, if the alignment tool 206 is located within a preselected distance from a secondary object 204, the computer presents 116 or displays one or more attach points 208 to the user. In one embodiment, the computer displays only the nearest attach point 208 of one or more secondary objects 204 or may display all of the attach points 208 associated with one or more secondary objects 204. For example, the computer may display an attach point 208 at each corner of an annotation object, a text box object, an image object, a viewport object, or any other suitable secondary object. Alternatively, or in addition, the computer may display an attach point 208 at a midpoint of each side of annotation object, a text box object, an image object, or any other suitable secondary object. As another example, the computer may display an attach point 208 in the center of a callout object or any other suitable secondary object. In some embodiments, the user may enter a preference or configuration that causes the computer to display a particular attach point 208.

Figure 5A:
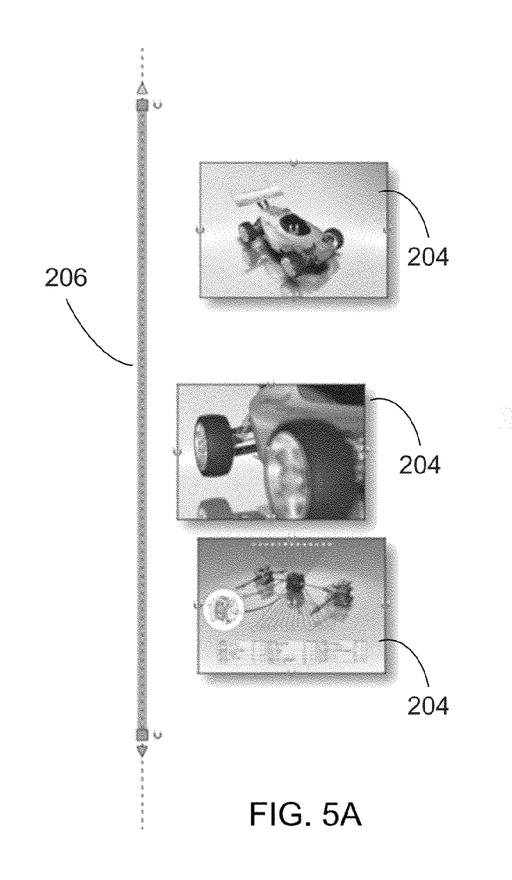
Figure 5B:
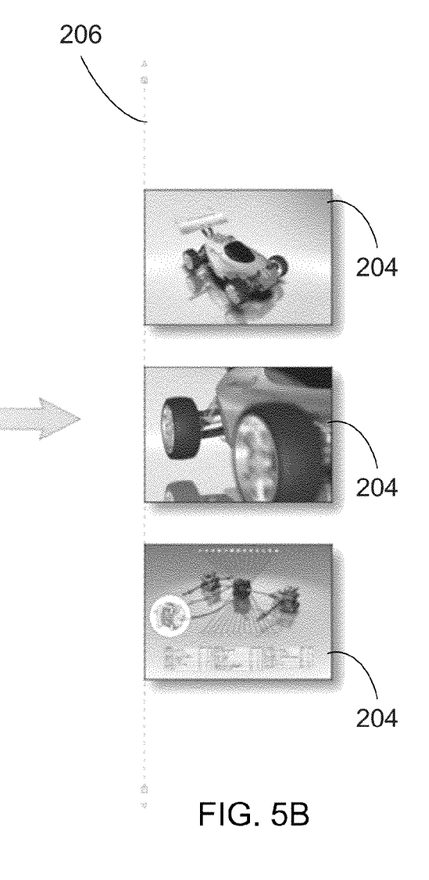
Figure 6A:
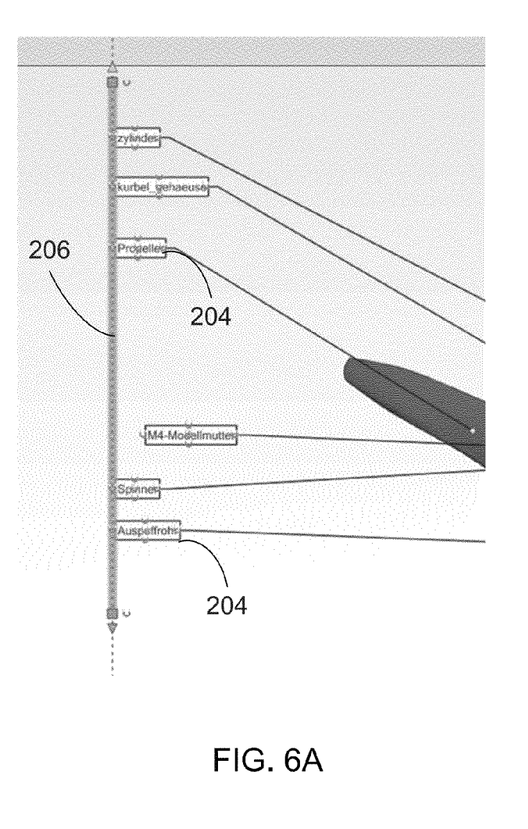
Figure 6B:
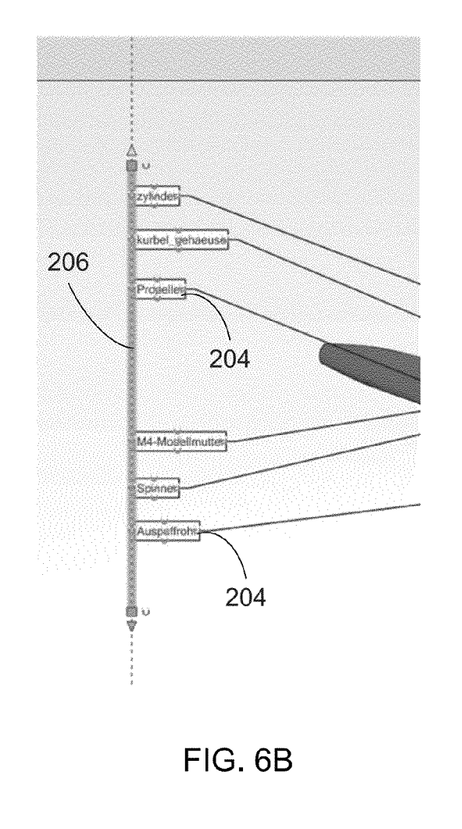
Figure 7A:
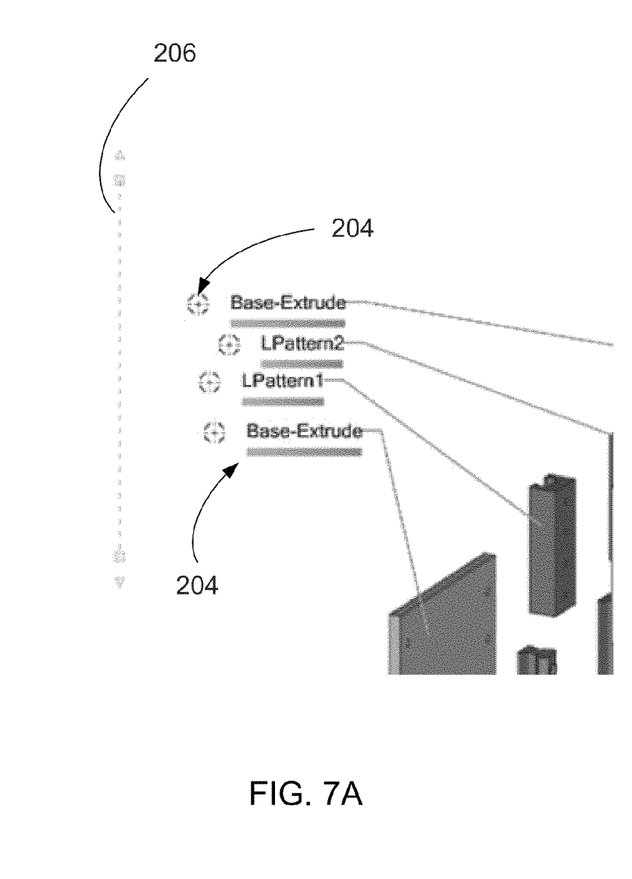
Figure 7B:
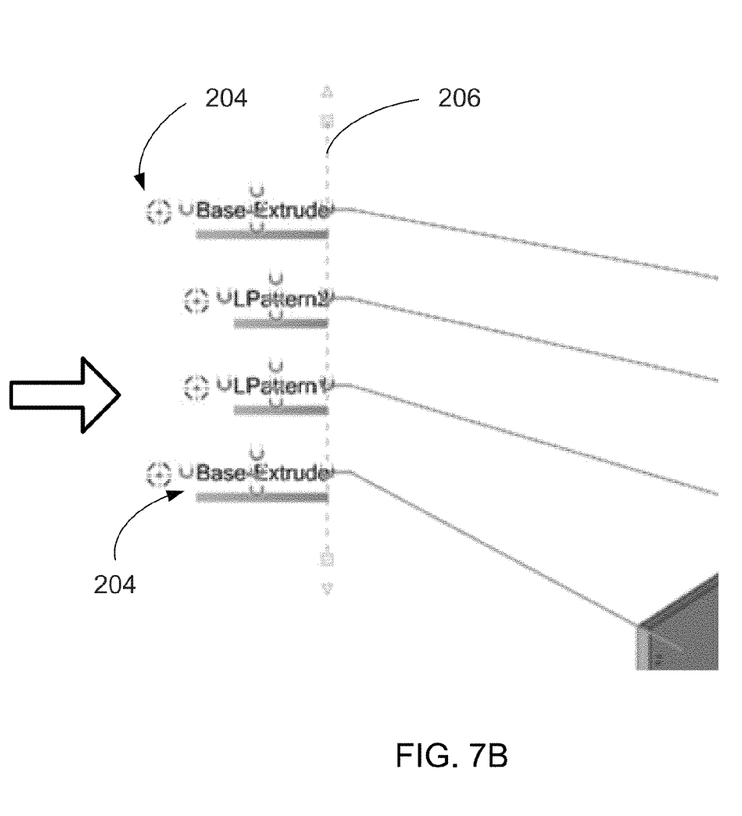

In an exemplary embodiment, and as the alignment tool 206 is further positioned 112 within the viewing area 202, the computer detects 118 whether the alignment tool 206 is located within a preselected distance of one or more of the displayed attach points 208. The distance may be measured in pixels, for example. If the alignment tool 206 is not located within a preselected distance from an attach point 208, the computer continues to measure and detect 118 whether the alignment tool 206 is located within a preselected distance from the attach point 208. However, if the alignment tool 206 is located within a preselected distance from an attach point 208, the computer positions 120, such as automatically positions 120, the associated secondary object 204 along the length of the alignment tool 206 or about the perimeter of the alignment tool 206. If multiple secondary objects 204 are thus repositioned, the secondary objects 204 may be spaced equidistant along the length of the alignment tool 206 or along the perimeter of the alignment tool 206. In an exemplary embodiment, the secondary objects 204 are "snapped" to the alignment tool 206 similar to a magnet that acts on a suitable metal. The user may then again position the alignment tool 206, and the attached secondary objects 204 will be similarly repositioned. For example, as shown in FIGS. 5A and 5B, the user may drag the alignment tool 206 into contact with the secondary objects 204 such that the secondary objects 204 are snapped into aligned positions along the alignment tool 206. Specifically, the attach point 208 of each secondary object 204 nearest the alignment tool 206 is automatically brought into contact with the alignment tool 206 to snap the secondary objects 204 into their new positions. Alternatively, and as shown in FIGS. 6A and 6B, the user can drag an individual secondary object 204 into contact with the alignment tool 206, wherein the individual secondary object 204 is automatically snapped into position. Moreover, as shown in FIGS. 7A and 7B, a user can select multiple secondary objects 204 and then drag the selected secondary objects 204 into contact with the alignment tool 206, wherein the secondary objects 204 are automatically snapped into position. Furthermore, as shown in FIGS. 7A and 7B, the attach point 208 nearest the alignment tool 206 is not the only position at which secondary objects 204 can be attached to the alignment tool 206. Rather, for example, the attach point 208 that is furthest from the alignment tool 206 prior to moving the secondary objects 204 may be used to attach the secondary objects 204 to the alignment tool 206.

Figure 8:
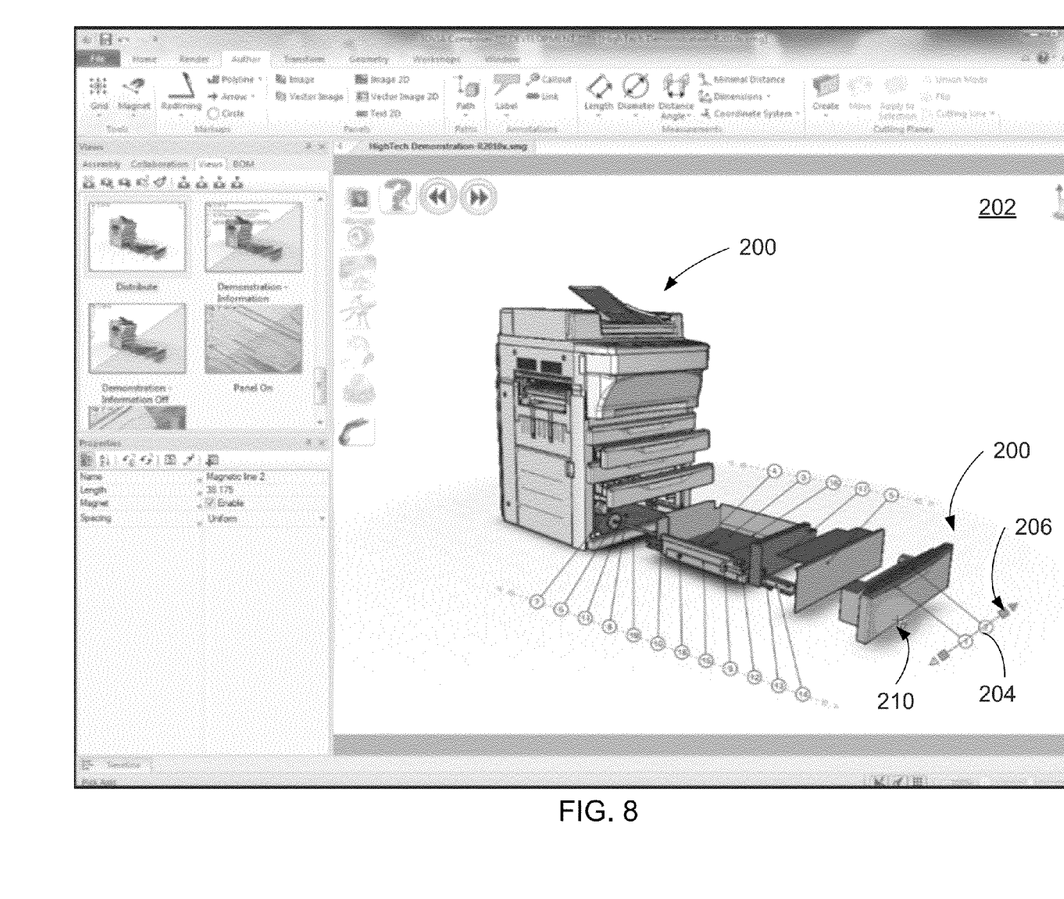

In some embodiments, the user can designate a surface or edge of the modeled object 200 and can then reposition the alignment tool 206 and, thus, the secondary objects 204. For example, and as shown in FIG. 8, the user can select a surface or edge 210 of the modeled object 200 using an input device, and can then use an application function to cause the alignment tool 206 to be repositioned, such as automatically "snapped," into a new position based on the orientation of the selected surface or edge 210. The movement of the alignment tool 206 thus causes the secondary objects 204 to be automatically repositioned based on the direction and amount of movement of the alignment tool 206.

Figure 9:
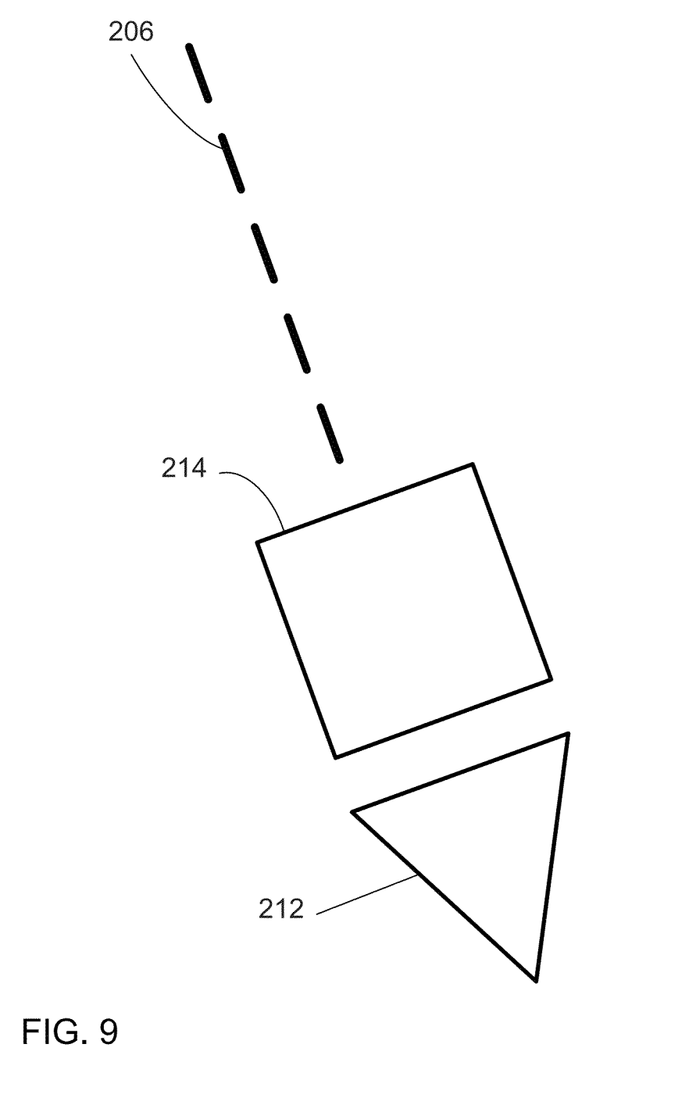
FIGS. 9 and 10 are renderings of an exemplary alignment tool according to embodiments of the present advancements.

In some embodiments, the user can modify the alignment tool 206. For example, and as shown in FIG. 9, the user can adjust the length of the alignment tool 206 by repositioning using a first manipulator 212, such as by dragging the first manipulator 212 using an input device. Specifically, the first manipulator 212 is used to extend the alignment tool 206. The spacing between secondary objects 204 may be affected by extending the alignment tool 206 using the first manipulator 212, based on user-configurable settings. For example, the user can set a property of the alignment tool 206 to maintain a constant distance between adjacent secondary objects 204 such that, when the user lengthens or shortens the alignment tool 206 using the first manipulator 212, the distance between adjacent secondary objects 204 does not change. Alternatively, the distance between adjacent secondary objects 204 may be proportional to the length of the alignment tool 206. Moreover, the distance may be set to remain unchanged regardless of whether the alignment tool 206 is lengthened or shortened using the first manipulator 212.

Moreover, in some embodiments, the user can display a property dialog associated with the alignment tool 206, and can then enter a new desired length. As another example, and when the alignment tool 206 has a circular or oval shape, the user can adjust the diameter of the alignment tool 206 by repositioning one end or side of the alignment tool 206, such as by dragging one or both ends of the alignment tool 206 using an input device. Similarly and when the alignment tool 206 has a square or rectangular shape, the user can adjust the width or height of the alignment tool 206 by dragging one or both ends of the alignment tool 206 using an input device. It should be understood that the shape of the alignment tool 206 is not limited to lines, circles, ovals, squares, or rectangles but, rather, any suitable shape may be used that facilitates repositioning secondary objects 204 as described herein.

Figure 10:
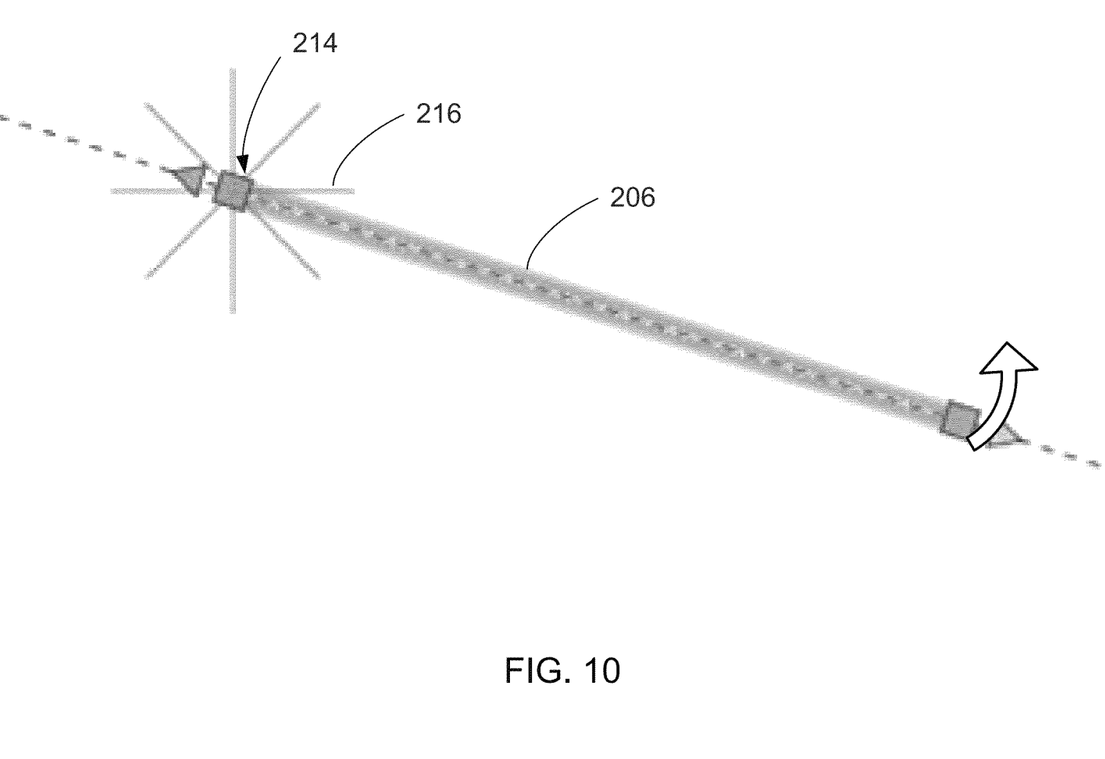

In some embodiments, the user can rotate the alignment tool 206 and, thus, the secondary objects 204, about a second manipulator 214. For example, and as shown in FIGS. 9 and 10, when a user selects the second manipulator 214, a directional assistant 216 is displayed at the opposite end of the alignment tool 206. As the user drags the selected second manipulator 214, the rotation of the alignment tool 206 about the directional assistant 216 causes the secondary objects 204 to be automatically repositioned based on the direction and amount of rotation of the alignment tool 206.

In some embodiments, the user can also modify the order in which the secondary objects 204 are positioned along the alignment tool 206. For example, the user can modify the position of a specified secondary object 204 along the alignment tool 206 by repositioning the specified secondary object 204, such as by dragging the specified secondary object 204 using an input device.

Figure 11:
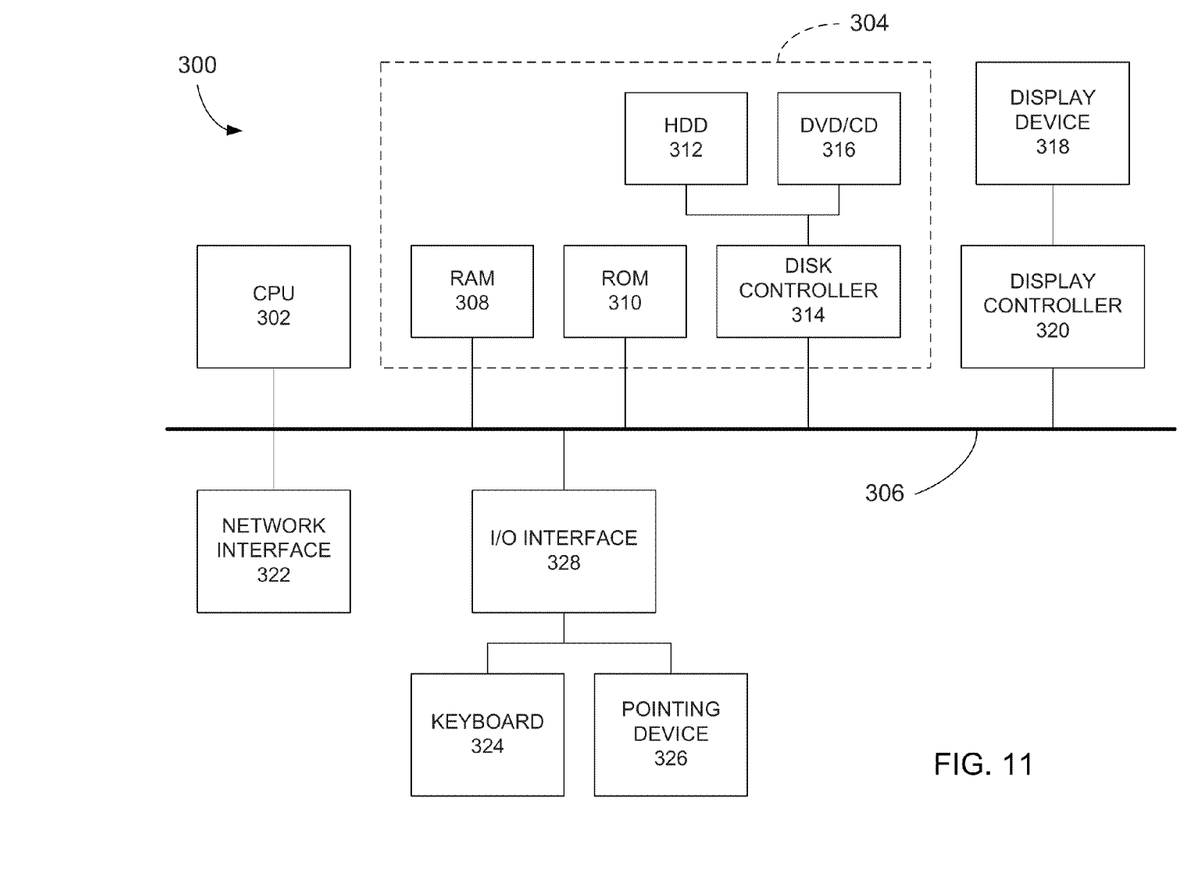
FIG. 11 is a schematic block diagram of an exemplary computer-aided design station configured to automatically align one or more secondary objects using an alignment tool.

FIG. 11 is a schematic block diagram of an exemplary computer-aided design station 300, which may also be referred to herein as a computer system. As used herein, the terms "computer-aided design station" and "computer system" refer generally to any suitable computing device that may be used to perform the processes described above and/or any additional processes that may be related to those described above.

In an exemplary embodiment, the computer-aided design station 300 includes one or more processors 302 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 304 that is operably and/or communicatively coupled to the processor 302 by a system bus 306. A "memory area," as used herein, refers generally to any means of storing program code and instructions executable by one or more processors to aid in automatically aligning one or more secondary objects using an alignment tool. The memory area 304 may include one, or more than one, forms of memory. For example, the memory area 304 may include random-access memory (RAM) 308, which can include non-volatile RAM, magnetic RAM, ferroelectric RAM, and/or other forms of RAM. The memory area 304 may also include read-only memory (ROM) 310 and/or flash memory and/or electrically-programmable read-only memory (EEPROM). Any other suitable magnetic, optical, and/or semiconductor memory, such as a hard-disk drive (HDD) 312, by itself or in combination with other forms of memory, may be included in the memory area 304. HDD 312 may also be coupled to a disk controller 314 for use in transmitting and receiving messages to and from processor 302. Moreover, the memory area 304 may also be, or may include, a detachable or removable memory 316, such as a suitable cartridge disk, CD-ROM, DVD, or USB memory. The above examples are exemplary only and, thus, are not intended to limit in any way the definition and/or meaning of the term "memory area."

The computer-aided design station 300 also includes a display device 318 that is coupled, such as operably coupled, to a display controller 320. The display controller 320 receives data via the system bus 306 for display by the display device 318. The display device 318 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 318 may include a touchscreen with an associated touchscreen controller. The above examples are exemplary only and, thus, are not intended to limit in any way the definition and/or meaning of the term "display device."

In addition, the computer-aided design station 300 includes a network interface 322 for use in communicating with a network (not shown in FIG. 11). Moreover, the computer-aided design station 300 includes one or more input devices, such as a keyboard 324 and/or a pointing device 326, such as a roller ball, mouse, touchpad, and the like. The input devices are coupled to and controlled by an input/output (I/O) interface 328, which is further coupled to the system bus 306.

A description of the general features and functionality of the display device 318, keyboard 324, pointing device 326, as well as the display controller 320, disk controller 314, network interface 322, and I/O interface 328 is omitted herein for brevity as these features are known.

Figure 12:
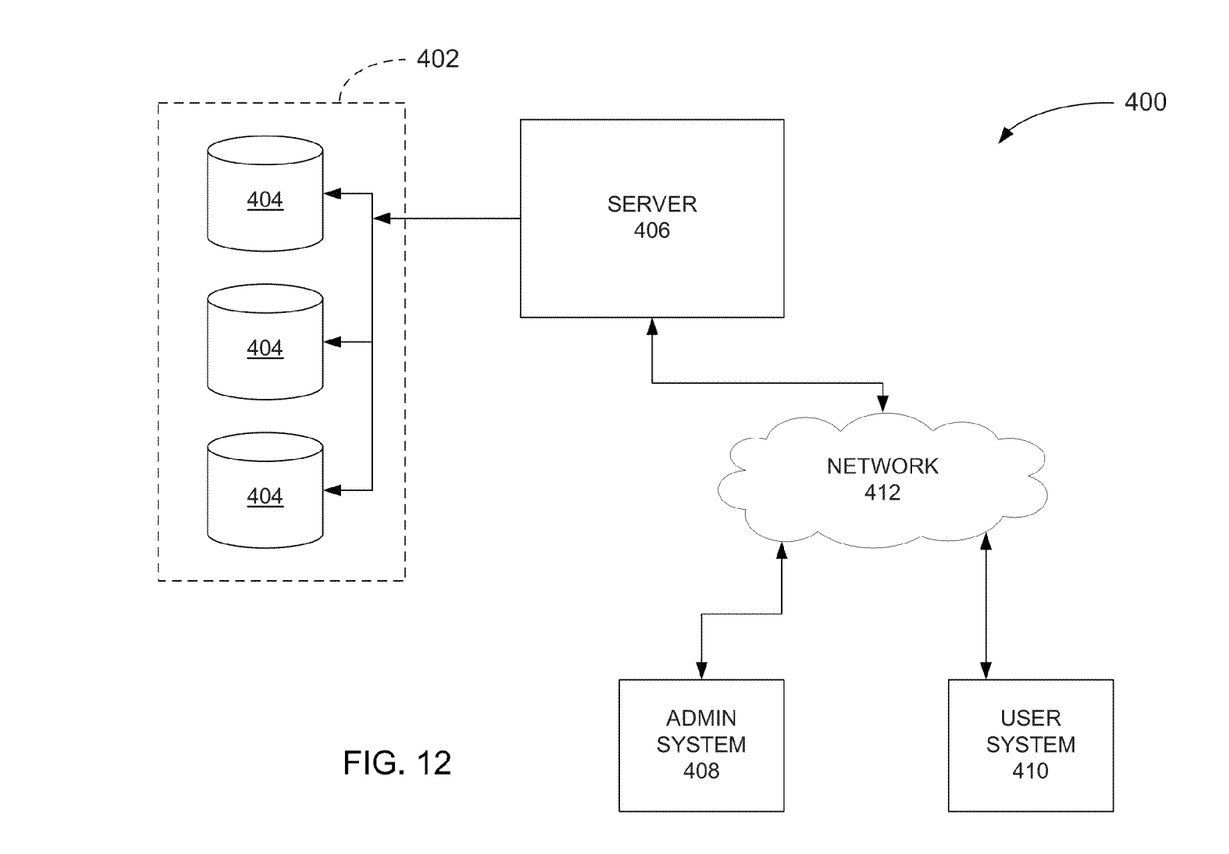
FIG. 12 is a schematic block diagram of an exemplary computer-aided design system configured to automatically align one or more secondary objects using an alignment tool.

FIG. 12 is a schematic block diagram of an exemplary system 400 for use in computer-aided design of a modeled object, such as the processes described above and/or additional processes that may be related to those described above. In an exemplary embodiment, a memory area 402 includes one or more storage devices 404 for use in storing CAD data, such as modeled object data, secondary object data, and/or positioning data related to secondary objects and/or attach points of secondary objects. In some embodiments, the memory area 402 is coupled to a server 406, which is in turn coupled to an administrator system 408 and/or a user system 410 via a network 412. The storage devices 404 may be embodied as one or more databases, may be located at a single or at multiple geographical sites, or may be integrated with the server 406.

As can be appreciated, the network 412 can be a public network, such as the Internet, or a private network such as an LAN or WAN network, or any combination thereof and can also include PSTN or ISDN sub-networks. The network 412 can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network 412 is merely exemplary and in no way limits the scope of the present advancements.

As one of ordinary skill in the art would recognize, the administrator system 408 and/or the user system 410 can be a computer-aided design station such as the one described above with reference to FIG. 11, or any other computing system that is known. Moreover, it should be understood that the administrator system 408 and/or the user system 410 are configured to perform the processes described above and/or any additional processes that may be related to those described above.

The server 406 stores the computer-readable instructions to execute the processes described above and provides these instructions via the network 412 to the administrator system 408 and/or the user system 410. Moreover, the server 406 can also provide data from the memory area 402 as needed to the administrator system 408 and the user system 410. As such, FIG. 12 includes implementations of the system 400 via cloud computing, distributed computing and the like.

Exemplary embodiments of systems, methods, apparatus, computer program products, and computer-readable storage media for use in computer-aided design of a modeled object are described above in detail. The systems, methods, apparatus, computer program products, and computer-readable storage media are not limited to the specific embodiments described herein but, rather, operations of the methods, program products and/or storage media, as well as components of the system and/or apparatus, may be utilized independently and separately from other operations and/or components described herein. Further, the described operations and/or components may also be defined in, or used in combination with, other systems, methods, apparatus, program products and/or storage media, and are not limited to practice with only the systems, methods, apparatus, program products and storage media as described herein.

A computer or computer system, such as those described herein, includes at least one processor or processing unit and a system memory. The computer or computer system typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Exemplary computer-executable components for use in the processes described above include, but are not limited to only including, a display component that causes the processor 302 (shown in FIG. 11) to present a modeled object 200 and a plurality of secondary objects 204 in viewing area 202 (each shown in FIGS. 2-8) of a display device 318 (shown in FIG. 11). The components also include an interface component that causes the processor 302 to receive user inputs via, for example, the I/O interface 328 (shown in FIG. 11). As described above, the user inputs may be related to use of CAD software to design the modeled object 200, creating the secondary objects 204, creating an instance of an alignment tool 206 (shown in FIGS. 3-10), and/or to automatically positioning the secondary objects 204 with respect to and/or along a length of the alignment tool 206.

Moreover, the components include an alignment component that causes the processor 302 to present attach points 208 (shown in FIG. 4) in viewing area 202 based on user input, detect when the alignment tool 206 is moved by the user to a position within a preselected distance from one or more of the secondary objects 204 and/or attach points 208, and automatically align the one or more secondary objects 204 with respect to the alignment tool 206. In some embodiments, the alignment component also causes the processor 302 to detect the position of one or more of the attach points 208 of the secondary objects 204, and to present the one or more attach points 208 when the alignment tool 206 is moved by the user to a position within a preselected distance from the secondary object 204. Moreover, in some embodiments, the alignment component causes the processor 302 to reposition one or more of the secondary objects 204 along the length or perimeter of the alignment tool 206 in response to user inputs.

Furthermore, in some embodiments, the alignment component causes the processor 302 to select a point or portion of the modeled object 200, such as a surface or an edge 210 (shown in FIG. 8) of the modeled object 200, and to automatically reposition the alignment tool 206 and, thus, the secondary objects 204 with respect to the selected point or portion. In addition, in some embodiments, the alignment component causes the processor 302 to enable the user to rotate the alignment tool 206 about a second manipulator 214 (shown in FIGS. 9 and 10) on the alignment tool 206.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of well known computer systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-aided design station for use in computer-aided design of a modeled object, said computer-aided design station comprising:
   a display device configured to display the modeled object and at least one secondary object in a viewing area;
   an interface device configured to receive user inputs relating to the modeled object and the viewing area; and
   a processor operably coupled to said display device and said interface device, said processor configured to:
      in response to user input, cause said display device to display an alignment tool in the viewing area;
      detect when the alignment tool is moved to a position within a first preselected distance from the at least one secondary object, thereby performing a movement detection;
      based upon the movement detection, cause said display device to display at least one attach point of the at least one secondary object for attachment to the alignment tool; and
      automatically align the at least one secondary object with respect to the alignment tool.

2. The computer-aided design station according to claim 1, wherein said processor is further configured to detect an alignment property of the viewing area, the alignment property designating whether the alignment tool is available.

3. The computer-aided design station according to claim 1, wherein said processor is further configured to detect a position of the at least one attach point of the at least one secondary object.

4. The computer-aided design station according to claim 1, wherein said processor is further configured to cause said display device to display the at least one attach point of the at least one secondary object when the alignment tool is moved to a position within a second preselected distance from the at least one secondary object.

5. The computer-aided design station according to claim 1, wherein the at least one secondary object includes a plurality of secondary objects, said processor further configured to reposition at least a portion of the plurality of secondary objects with respect to the alignment tool in response to user input.

6. The computer-aided design station according to claim 1, wherein said processor is further configured to select a portion of the modeled object in response to user input and automatically position the alignment tool with respect to the selected portion.

7. The computer-aided design station according to claim 1, wherein said processor is further configured to:
   adjust at least one of a shape of the alignment tool and a dimension of the alignment tool based on user input; and
   re-align the at least one secondary object with respect to the alignment tool based on the adjustment.

8. The computer-aided design station according to claim 1, wherein the alignment tool is one of a line and a bounded geometric shape.

9. The computer-aided design station according to claim 1, wherein the at least one secondary object is one of an annotation, an image, and a text box.

10. A computer program product comprising:
    one or more non-transitory computer-readable storage media having computer-executable components for use in computer-aided design of a modeled object, said components comprising:
    a display component that when executed by at least one processor causes the at least one processor to present the modeled object and a plurality of secondary objects in a viewing area of a display device;
    an interface component that when executed by the at least one processor causes the at least one processor to receive user inputs; and
    an alignment component that when executed by the at least one processor causes the at least one processor to:
       in response to user input, present an alignment tool in the viewing area;
       detect when the alignment tool is moved to a position within a first preselected distance from at least a portion of the secondary objects, thereby performing a movement detection;
       based upon the movement detection, present at least one attach point of the at least a portion of the secondary objects for attachment to the alignment tool; and
       automatically align the at least a portion of the secondary objects with respect to the alignment tool.

11. The computer program product according to claim 10, wherein said alignment component further causes the at least one processor to detect a position of the at least one attach point of each of the secondary objects.

12. The computer program product according to claim 11, wherein said display component further causes the at least one processor to present the at least one attach point of each of the secondary objects when the alignment tool is moved to a position within a second preselected distance from the secondary objects.

13. The computer program product according to claim 10, wherein said alignment component further causes the at least one processor to reposition at least a portion of the secondary objects with respect to the alignment tool in response to user input.

14. The computer program product according to claim 10, wherein said alignment component further causes the at least one processor to select a portion of the modeled object in response to user input and automatically position the alignment tool with respect to the selected portion.

15. The computer program product according to claim 10, wherein said alignment component further causes the at least one processor to:
adjust at least one of a shape of the alignment tool and a dimension of the alignment tool based on user input; and
re-align the at least one secondary object with respect to the alignment tool based on the adjustment.

16. A computer-implemented method comprising:
displaying a modeled object and a plurality of secondary objects in a viewing area of a display device;
receiving user inputs relating to at least one of the modeled object, the secondary objects, and the viewing area;
in response to user input, displaying an alignment tool in the viewing area;
detecting when the alignment tool is moved to a position within a first preselected distance from one or more of the secondary objects, thereby performing a movement detection;
based upon the movement detection, displaying at least one attach point of the one or more of the secondary objects for attachment to the alignment tool; and
automatically aligning one or more of the secondary objects with respect to the alignment tool.

17. The computer-implemented method of claim 16, further comprising detecting a position of the at least one attach point of one or more of the secondary objects.

18. The computer-implemented method of claim 17, further comprising displaying the at least one attach point of one or more of the secondary objects when the alignment tool is moved to a position within a second preselected distance from one or more of the secondary objects.

19. The computer-implemented method of claim 16, further comprising repositioning one or more of the secondary objects with respect to the alignment tool in response to user input.

20. The computer-implemented method of claim 16, further comprising selecting a portion of the modeled object in response to user input and automatically positioning the alignment tool with respect to the selected portion.

21. The computer-implemented method of claim 16, further comprising:
adjusting at least one of a shape of the alignment tool and a dimension of the alignment tool based on user input; and
re-aligning the at least one secondary object with respect to the alignment tool based on the adjustment.

22. A system for use in computer-aided design of a modeled object, said system comprising:
a memory area configured to store at least one attach point related to each of a plurality of secondary objects; and
a computer system coupled to said memory area, said computer system configured to:
present the modeled object and one or more of the secondary objects in a viewing area of a display device;
receive user inputs relating to the modeled object and the viewing area;
in response to user input, present an alignment tool in the viewing area;
detect when the alignment tool is moved to a position within a first preselected distance from one or more of the secondary objects, thereby performing a movement detection;
based upon the movement detection, present the at least one attach point associated with the one or more of the secondary objects for attachment to the alignment tool; and
automatically align one or more of the secondary objects with respect to the alignment tool.

23. The system according to claim 22, wherein said computer system is further configured to detect a position of the at least one attach point of one or more of the secondary objects and to present the at least one attach point of one or more of the secondary objects when the alignment tool is moved to a position within a second preselected distance from one or more of the secondary objects.

24. The system according to claim 22, wherein said computer system is further configured to select a portion of the modeled object in response to user input and automatically position the alignment tool with respect to the selected portion.

25. The system according to claim 22, wherein said computer system is further configured to:
adjust at least one of a shape of the alignment tool and a dimension of the alignment tool based on user input; and
re-align the at least one secondary object with respect to the alignment tool based on the adjustment.

\* \* \* \* \*